(12) United States Patent
Hong

(10) Patent No.: US 11,121,067 B2
(45) Date of Patent: Sep. 14, 2021

(54) INTERPOSER AND ELECTRONIC DEVICE INCLUDING THE SAME

(71) Applicant: Samsung Electronics Co., Ltd., Gyeonggi-do (KR)

(72) Inventor: Eunseok Hong, Gyeonggi-do (KR)

(73) Assignee: Samsung Electronics Co., Ltd

( * ) Notice: Subject to any disclaimer, the term of this patent is extended or adjusted under 35 U.S.C. 154(b) by 28 days.

(21) Appl. No.: 16/791,575

(22) Filed: Feb. 14, 2020

(65) Prior Publication Data

US 2020/0266138 A1 Aug. 20, 2020

(30) Foreign Application Priority Data

Feb. 14, 2019 (KR) .......................... 10-2019-0016981

(51) Int. Cl.
  *H01L 23/498* (2006.01)
  *H01L 23/528* (2006.01)
  *H01L 25/065* (2006.01)

(52) U.S. Cl.
  CPC .. *H01L 23/49822* (2013.01); *H01L 23/49833* (2013.01); *H01L 23/5286* (2013.01); *H01L 25/0657* (2013.01)

(58) Field of Classification Search
  CPC .......... H01L 23/49822; H01L 23/5286; H01L 23/49833; H01L 2225/06551; H01L 25/0657; H05K 3/403; H05K 2201/10378
  See application file for complete search history.

(56) References Cited

U.S. PATENT DOCUMENTS 6,461,895 B1 * 10/2002 Liang ....................... G11C 7/02
  257/E23.067
9,219,039 B2  12/2015 Kuo et al.
  (Continued)

FOREIGN PATENT DOCUMENTS

| KR | 2009-0080701 | 7/2009 |
| KR | 1020140065277 | 5/2014 |
| KR | 1020190009232 | 1/2019 |

OTHER PUBLICATIONS

International Search Report dated Jun. 9, 2020 issued in counterpart application No. PCT/KR2020/002157, 3 pages.

*Primary Examiner* — Nicholas J Tobergte
(74) *Attorney, Agent, or Firm* — The Farrell Law Firm, P.C.

(57) ABSTRACT

An electronic device includes a housing, a first substrate disposed in the housing and configured to face a first direction, wherein the first substrate includes a first interconnection, a second substrate located in the first direction from the first substrate, wherein the second substrate includes a second interconnection, and a plurality of interposers formed between the first substrate and the second substrate to electrically connect the first interconnection and the second interconnection, wherein the plurality of interposers is configured to at least partially surround a shielded space formed between the first substrate and the second substrate, wherein each of the plurality of interposers includes a plurality of layers configured to face a direction perpendicular to the first direction, and wherein at least one of the plurality of layers includes a conductive pattern that extends in the first direction and is electrically connected with the first interconnection and the second interconnection.

20 Claims, 12 Drawing Sheets

(56) References Cited

U.S. PATENT DOCUMENTS

| | | | |
|---|---|---|---|
| 9,853,002 B2 | 12/2017 | Kariyazaki | |
| 10,147,690 B2 | 12/2018 | Kariyazaki | |
| 10,410,983 B2 | 9/2019 | Kamgaing et al. | |
| 10,971,479 B2* | 4/2021 | Lee | H01L 25/0652 |
| 2009/0189624 A1* | 7/2009 | Oh | G01R 1/07378 |
| | | | 324/754.07 |
| 2013/0134553 A1 | 5/2013 | Kuo et al. | |
| 2014/0001609 A1 | 1/2014 | Kuo et al. | |
| 2016/0071805 A1 | 3/2016 | Kuo et al. | |
| 2017/0179050 A1 | 6/2017 | Kariyazaki | |
| 2017/0278830 A1* | 9/2017 | Kim | H01L 25/50 |
| 2018/0025998 A1 | 1/2018 | Kariyazaki | |
| 2018/0323159 A1 | 11/2018 | Kamgaing et al. | |
| 2019/0027804 A1 | 1/2019 | Kim et al. | |

* cited by examiner

INTERPOSER AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2019-0016981, filed on Feb. 14, 2019, in the Korean Intellectual Property Office, the entire disclosure of which is incorporated herein by reference.

BACKGROUND

1. Field

The disclosure relates generally to an interposer and an electronic device including the same.

2. Description of Related Art

As various functions are added to a mobile electronic device, more electrical elements are mounted on a substrate in the mobile electronic device. However, the mobile electronic device may lack a mounting space for the substrate due to the compactness of the mobile electronic device.

To efficiently utilize an insufficient mounting space, a recent mobile electronic device may include two or more stacked substrates. In this case, the mobile electronic device may include an interposer for electrically connecting the two or more stacked substrates.

The interposer may be of a connector type in which conductors for providing electrical paths between substrates are subjected to molding using an insulating material, or may be of a printed circuit board (PCB) type in which conductive vias are formed.

A PCB type interposer provides electrical paths between two substrates through conductive vias that pass through conductive layers and insulation layers (pre-impregnated layers or pre-preg (PPG) layers) alternately stacked one above another.

The above information is presented as background information only to assist with an understanding of the present disclosure. No determination has been made, and no assertion is made, as to whether any of the above might be applicable as prior art with regard to the present disclosure.

The PCB type interposer includes the layers laminated in the stack direction of the substrates and the conductive VIAs that pass through the layers. The conductive VIAs are formed by forming via-holes through the layers and filling the via-holes with a conductive material.

The via-holes are formed by a mechanical drilling process. Therefore, the via-holes have a diameter of at least 0.25 mm or more. A laser drilling process may form a smaller hole than the mechanical drilling process but cannot form a hole through an insulation layer. Considering that the size of the interposer is limited, the via-holes having a diameter of 0.25 mm or more cannot provide a sufficient number of electrical paths.

SUMMARY

An aspect of the disclosure provides an interposer for providing a sufficient number of electrical paths capable of connecting a plurality of electric elements included in substrates, and an electronic device including the interposer.

In accordance with an aspect of the disclosure, an electronic device is provided. The electronic device includes a housing, a first substrate disposed in the housing and configured to face a first direction, wherein the first substrate includes a first interconnection, a second substrate located in the first direction from the first substrate, wherein the second substrate includes a second interconnection, and a plurality of interposers formed between the first substrate and the second substrate to electrically connect the first interconnection and the second interconnection, wherein the plurality of interposers is configured to at least partially surround a shielded space formed between the first substrate and the second substrate, wherein each of the plurality of interposers includes a plurality of layers configured to face a direction perpendicular to the first direction, and wherein at least one of the plurality of layers includes a conductive pattern that extends in the first direction and is electrically connected with the first interconnection and the second interconnection.

In accordance with another aspect of the disclosure, an electronic device is provided. The electronic device includes a housing, a first substrate disposed in the housing, a second substrate disposed in the housing and spaced apart from the first substrate, and an interposer disposed between the first substrate and the second substrate, wherein the interposer is formed to surround at least part of any space between the first substrate and the second substrate, wherein the interposer includes a first conductive layer configured to face toward the at least part of any space between the first substrate and the second substrate, a second conductive layer opposite to the first conductive layer, a pattern layer formed between the first conductive layer and the second conductive layer, wherein the pattern layer includes a conductive pattern, and insulation layers formed between the pattern layer and the first conductive layer and between the pattern layer and the second conductive layer, and wherein the interposer is disposed between the first substrate and the second substrate such that the first conductive layer faces toward the at least part of any space between the first substrate and the second substrate and the conductive pattern extends from the first substrate to the second substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Hereinafter, various embodiments of the disclosure are described with reference to the accompanying drawings. However, those of ordinary skill in the art will recognize that modification, equivalent, and/or alternative on the disclosure described herein may be variously made without departing from the scope and spirit of the disclosure as defined by the appended claims and their equivalents.

Figure 1:
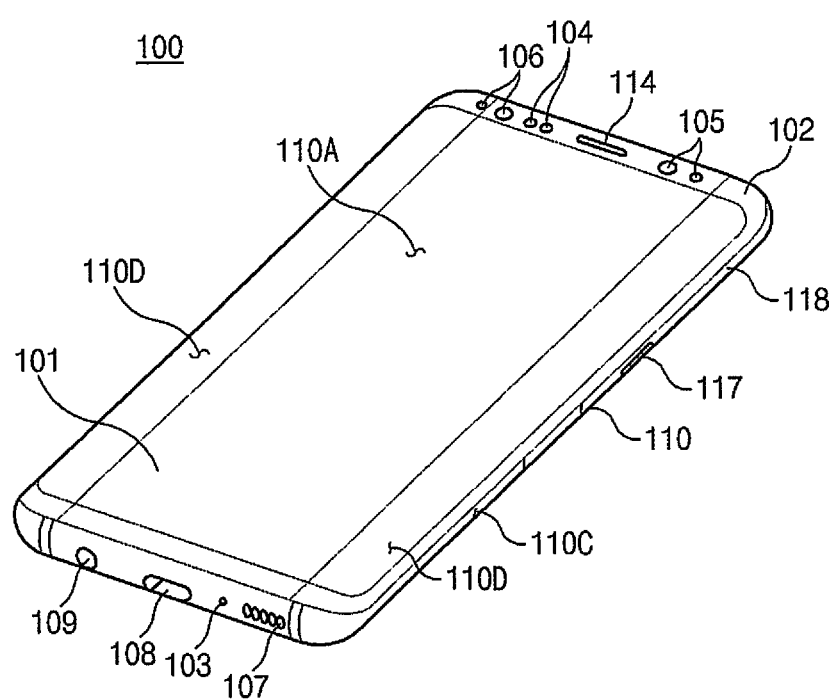
FIG. 1 is a front perspective view of an electronic device according to an embodiment.
Figure 2:
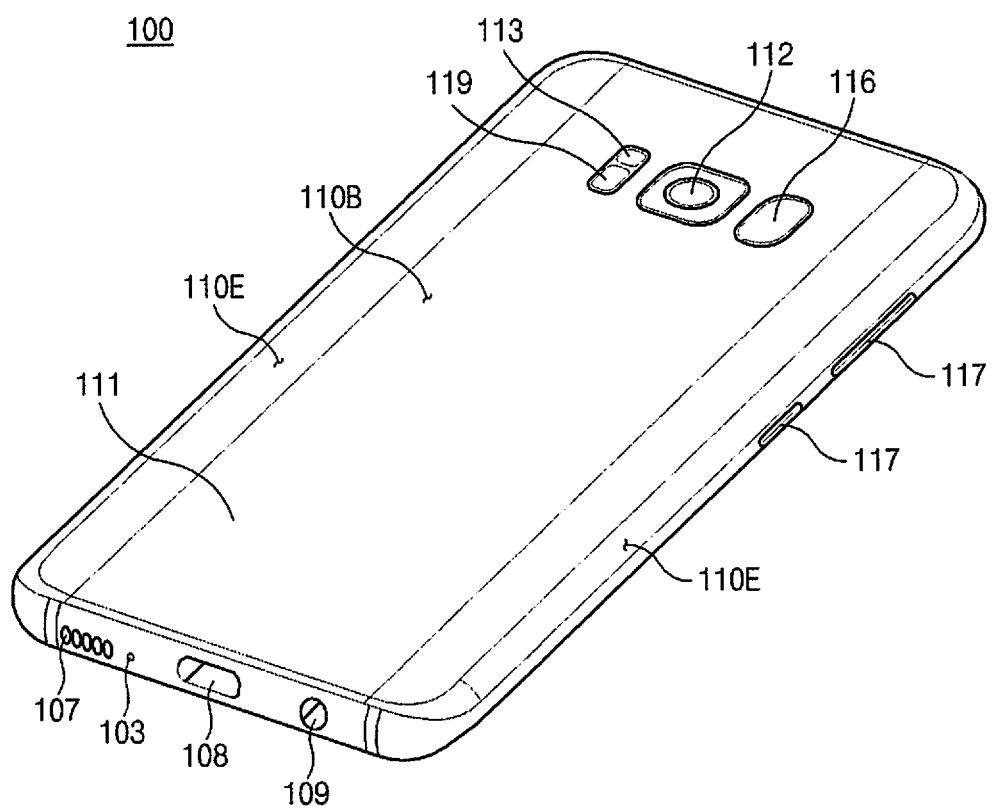
FIG. 2 is a rear perspective view of the electronic device illustrated in FIG. 1 according to an embodiment.
Figure 3:
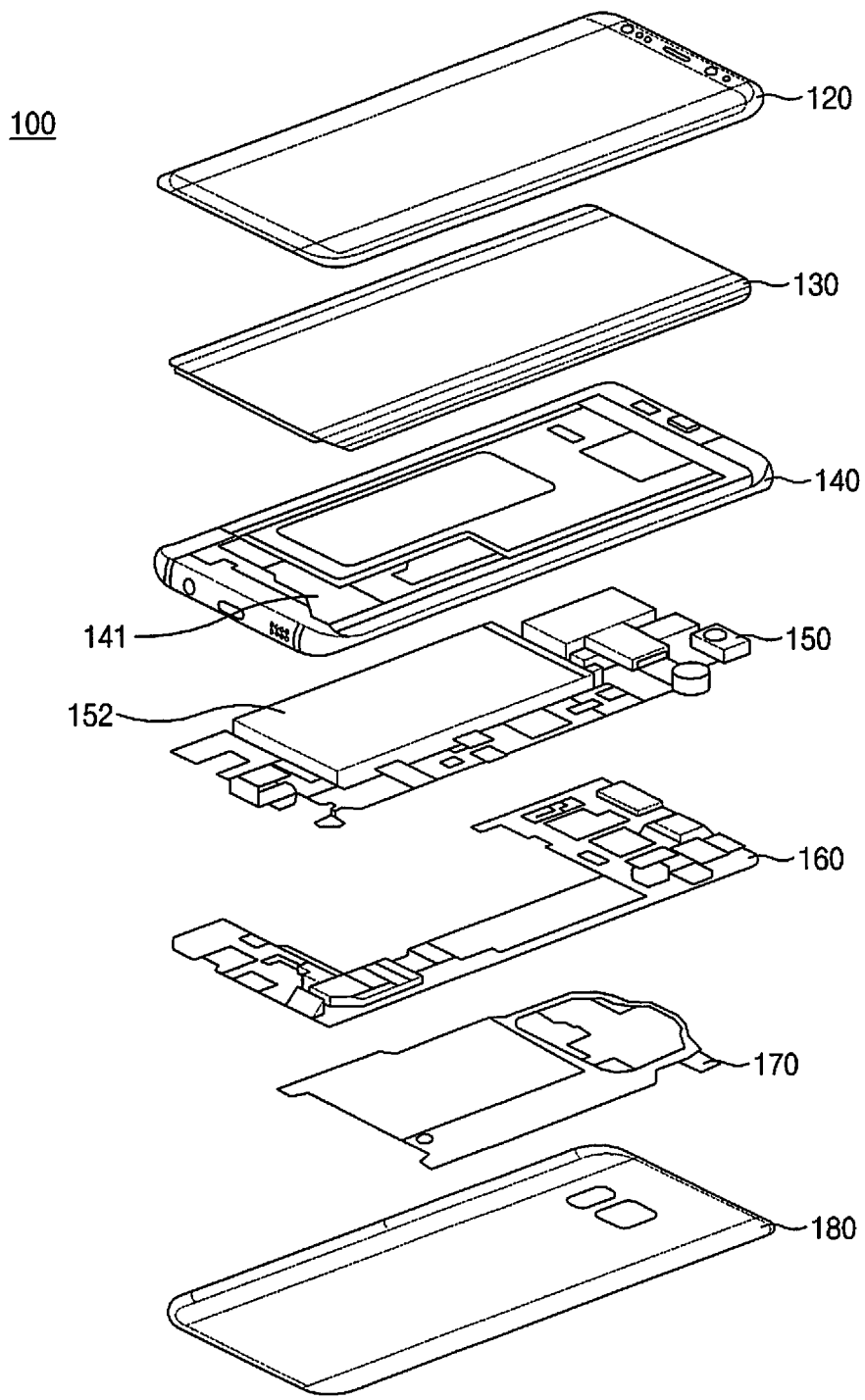
FIG. 3 is an exploded perspective view of the electronic device illustrated in FIG. 1 according to an embodiment.

FIG. 1 is a front perspective view of an electronic device 100 according to an embodiment. FIG. 2 is a rear perspective view of the electronic device 100 illustrated in FIG. 1. FIG. 3 is an exploded perspective view of the electronic device 100 illustrated in FIG. 1.

Referring to FIGS. 1 and 2, the electronic device 100 may include a housing 110 that includes a first surface (or a front surface) 110A, a second surface (or a rear surface) 110B, and side surfaces 110C that surround a space between the first surface 110A and the second surface 110B. A housing may refer to a structure that forms some of the first surface 110A, the second surface 110B, and the side surfaces 110C of FIG. 1. The first surface 110A may be formed by a front plate 102, at least a portion of which is substantially transparent (e.g., a glass plate or a polymer plate that includes various coating layers). The second surface 110B may be formed by a rear plate 111 that is substantially opaque. The rear plate 111 may be formed of, for example, coated or colored glass, ceramic, a polymer, metal (e.g., aluminum, stainless steel (STS), or magnesium), or a combination of at least two thereof. The side surfaces 110C may be formed by a side bezel structure (or a side member) 118 that is combined with the front plate 102 and the rear plate 111 and that contains metal and/or a polymer. The rear plate 111 and the side bezel structure 118 may be integrally formed with each other and may contain the same material (e.g., a metallic material such as aluminum).

The front plate 102 may include, at opposite long edges thereof, two first areas 110D that curvedly and seamlessly extend toward the rear plate 111 from the first surface 110A. The rear plate 111 may include, at opposite long edges thereof, two second areas 110E that curvedly and seamlessly extend toward the front plate 102 from the second surface 110B. The front plate 102 (or the rear plate 111) may include only one of the first areas 110D (or the second areas 110E). Some of the first areas 110D or the second areas 110E may be omitted. When viewed from a side of the electronic device 100, the side bezel structure 118 may have a first thickness (or width) at sides not including the first areas 110D or the second areas 110E and may have a second thickness less than the first thickness at sides including the first areas 110D or the second areas 110E.

The electronic device 100 may include at least one or more of a display 101, audio modules 103, 107, and 114, sensor modules 104, 116, and 119, camera modules 105, 112, and 113, key input devices 117, light emitting elements 106, and connector holes 108 and 109. The electronic device 100 may omit at least one component (e.g., the key input devices 117 or the light emitting elements 106) among the components, or may additionally include other component(s).

The display 101 may be exposed through, for example, a large portion of the front plate 102. At least a portion of the display 101 may be exposed through the front plate 102 that forms the first surface 110A and the first areas 110D of the side surfaces 110C. The edge of the display 101 may be formed to be substantially the same as the shape of the adjacent periphery of the front plate 102. The gap between the periphery of the display 101 and the periphery of the front plate 102 may be substantially constant to expand the area by which the display 101 is exposed.

Recesses or openings may be formed in a portion of a screen display area of the display 101, and the electronic device 100 may include at least one or more of the audio module 114, the sensor modules 104, the camera modules 105, and the light emitting elements 106 that are aligned with the recesses or the openings. The electronic device 100 may include, on a rear surface of the screen display area of the display 101, at least one or more of the audio module 114, the sensor modules 104, the camera modules 105, the fingerprint sensor 116, and the light emitting elements 106. The display 101 may be combined with, or disposed adjacent to, touch detection circuitry, a pressure sensor for measuring the intensity (pressure) of a touch, and/or a digitizer for detecting a stylus pen of a magnetic type. At least a part of the sensor modules 104 and 119 and/or at least a part of the key input devices 117 may be disposed in the first areas 110D and/or the second areas 110E.

The audio modules 103, 107, and 114 may include the microphone hole 103 and the speaker holes 107 and 114. A microphone for obtaining a sound from the outside may be disposed in the microphone hole 103, and a plurality of microphones may be disposed in the microphone hole 103 to sense the direction of a sound. The speaker holes 107 and 114 may include the external speaker hole 107 and the receiver hole 114 for a telephone call. The speaker holes 107 and 114 and the microphone hole 103 may be implemented with one hole, and a speaker (e.g., a piezoelectric speaker) may be included without the speaker holes 107 and 114.

The sensor modules 104, 116, and 119 may generate an electrical signal or a data value that corresponds to an operational state inside the electronic device 100 or an environmental state outside the electronic device 100. The sensor modules 104, 116, and 119 may include, for example, the first sensor module 104 (e.g., a proximity sensor) and/or the second sensor module (e.g., a fingerprint sensor) that is disposed on the first surface 110A of the housing, and/or the third sensor module 119 (e.g., a heart rate monitor (HRM) sensor) and/or the fourth sensor module 116 (e.g., a fingerprint sensor) that is disposed on the second surface 110B of the housing 110. The fingerprint sensor may be disposed not only on the first surface 110A of the housing 110 (e.g., the display 101) but also on the second surface 110B. The electronic device 100 may further include a sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or the illuminance sensor 104.

The camera modules 105, 112, and 113 may include the first camera device 105 disposed on the first surface 110A of the electronic device 100, and the second camera device 112 and/or the flash 113 disposed on the second surface 110B. The camera devices 105 and 112 may include one or more lenses, an image sensor, and/or an image signal processor. The flash 113 may include, for example, a light emitting diode (LED) or a xenon lamp. Two or more lenses (an IR camera lens, a wide angle lens, and a telephoto lens) and image sensors may be disposed on one surface of the electronic device 100.

The key input devices 117 may be disposed on the side surfaces 110C of the housing 110. The electronic device 100 may not include all or some of the aforementioned key input devices 117, and the key input devices 117 not included may be implemented in different forms such as soft keys on the display 101. The key input devices 117 may include the sensor module 116 disposed on the second surface 110B of the housing 110.

The light emitting elements 106 may be disposed on, for example, the first surface 110A of the housing 110. The light emitting elements 106 may provide, for example, state information of the electronic device 100 in the form of light. The light emitting elements 106 may provide, for example, a light source that operates in conjunction with the operation of the camera module 105. The light emitting elements 106 may include, for example, an LED, an IR LED, and a xenon lamp.

The connector holes 108 and 109 may include the first connector hole 108 in which a connector (e.g., a universal serial bus (USB) connector) for transmitting and receiving power and/or data with an external electronic device is received, and/or the second connector hole 109 (e.g., an earphone jack) in which a connector for transmitting and receiving audio signals with an external electronic device is received.

Referring to FIG. 3, the electronic device 100 may include a side member 140, a first support member 141 (e.g., a bracket), a front plate 120, a display 130, a printed circuit board 150, a battery 152, a second support member 160 (e.g., a rear case), an antenna 170, and a rear plate 180. The electronic device 100 may omit at least one component (e.g., the first support member 141 or the second support member 160) among the aforementioned components, or may additionally include other component(s). At least one of the components of the electronic device 100 may be the same as, or similar to, at least one of the components of the electronic device 100 of FIG. 1 or FIG. 2, and repetitive descriptions are omitted below.

The first support member 141 may be disposed in the electronic device 100 and may be connected with the side member 140, or may be integrally formed with the side member 140. The first support member 141 may be formed of, for example, a metallic material and/or a nonmetallic (e.g., polymer) material. The first support member 141 may have one surface to which the display 130 is coupled and an opposite surface to which the printed circuit board 150 is coupled. The printed circuit board 150 may have a processor, a memory, and/or an interface mounted thereon. The processor may include one or more of, for example, a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, a secure digital (SD) memory card interface, and/or an audio interface. The interface, for example, may electrically or physically connect the electronic device 100 with an external electronic device and may include a USB connector, an SD card/multimedia card (MMC) connector, or an audio connector.

The battery 152 may be a device for supplying power to at least one component of the electronic device 100 and may include, for example, a primary cell that is not rechargeable, a secondary cell that is rechargeable, or a fuel cell. For example, at least a portion of the battery 152 may be disposed on substantially the same plane as the printed circuit board 150. The battery 152 may be integrally disposed in the electronic device 100 and may be disposed so as to be detachable from the electronic device 100.

The antenna 170 may be disposed between the rear plate 180 and the battery 152. The antenna 170 may include, for example, a near field communication (NFC) antenna, a wireless charging antenna, and/or a magnetic secure transmission (MST) antenna. For example, the antenna 170 may perform short range communication with an external device, or may wirelessly transmit and receive power required for charging. An antenna structure may be formed by the side member 140 and/or a portion of the first support member 141, or a combination thereof.

Figure 4:
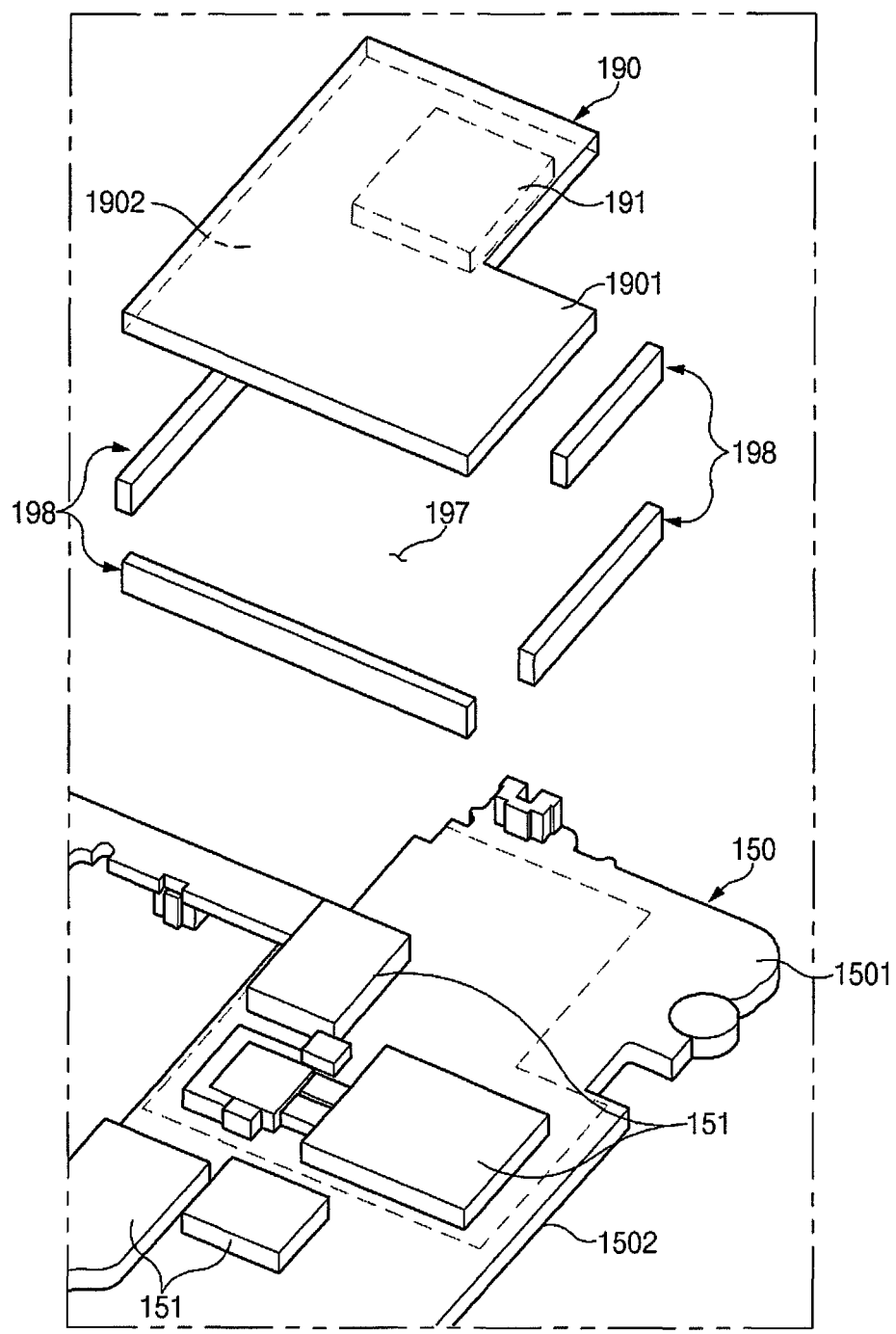
FIG. 4 is an exploded perspective view of an electronic device and interposers according to an embodiment.

FIG. 4 is an exploded perspective view of interposers 198, a first substrate 150, and a second substrate 190 of the electronic device 100 according to an embodiment.

In an embodiment, the electronic device 100 may include the first substrate 150, the second substrate 190 spaced apart from the first substrate 150 in a first direction, and the plurality of interposers 198 formed between the first substrate 150 and the second substrate 190.

The first substrate 150 may include one or more first electrical elements 151. The first substrate 150 may include a first surface 1501 facing the first direction and a second surface 1502 opposite to the first surface 1501. The first electrical elements 151 are illustrated as being disposed on the first surface 1501 of the first substrate 150. Without being necessarily limited thereto, however, some of the first electrical elements 151 may be disposed on the second surface 1502 of the first substrate 150.

The second substrate 190 may include one or more second electrical elements 191. The second substrate 190 may include a first surface 1901 facing the first direction and a second surface 1902 opposite to the first surface 1901. The second electrical elements 191 are illustrated as being disposed on the second surface 1902 of the second substrate 190. Without being necessarily limited thereto, however, some of the second electrical elements 191 may be disposed on the first surface 1901 of the second substrate 190.

The interposers 198 may be formed between the first substrate 150 and the second substrate 190. The interposers 198 may be formed in a substantially rectangular parallelepiped shape. The interposers 198 may be formed to electrically connect first interconnections included in the first substrate 150 and second interconnections included in the second substrate 190. Furthermore, the interposers 198 may form a shielded space 197 together with the first substrate 150 and the second substrate 190. The shielded space 197 may inhibit electromagnetic waves generated from inside (e.g., the first electrical element 151 and the second electrical element 191) from being radiated to the outside.

The first substrate 150, the second substrate 190, and the interposers 198 may form the shielded space 197. The shielded space 197 may include a partial area of the first substrate 150 (the area represented by a dotted line) and a partial area of the second substrate 190 that faces the partial area of the first substrate 150. The plurality of interposers 198 may be disposed between the first substrate 150 and the second substrate 190 to at least partially surround the shielded space 197.

The electronic device 100 may be configured such that the first electrical elements 151 and the second electrical 191 are mounted on the first substrate 150 and/or the second substrate 190 stacked above the first substrate 150, thereby ensuring a mounting area in spite of the compactness of the electronic device 100. Furthermore, the first electrical elements 151 and the second electrical 191 disposed on the respective substrates 150 and 190 may be electrically connected by the interposers 198.

Figure 5:
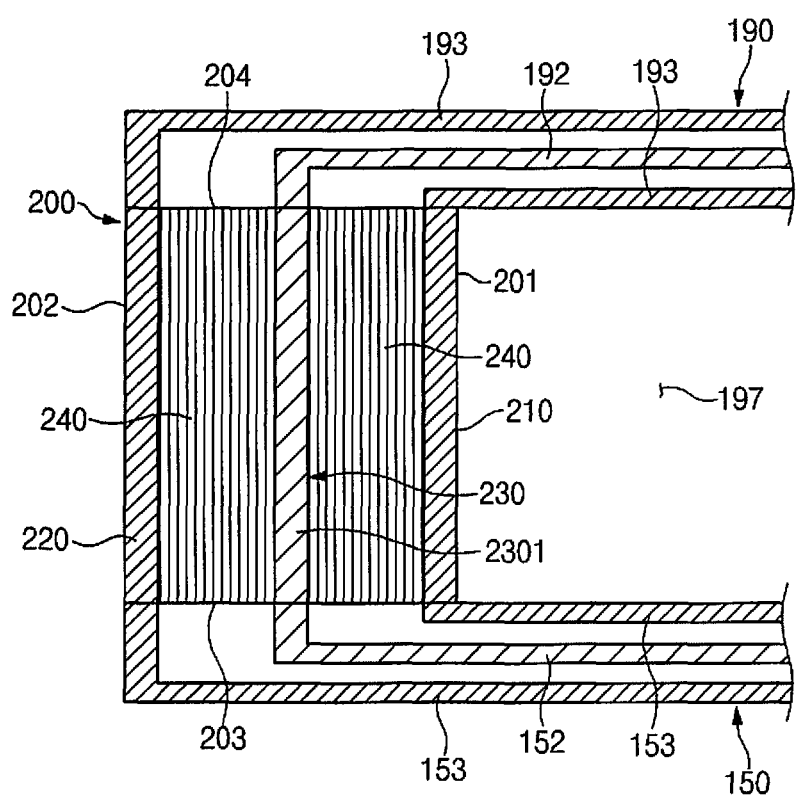
FIG. 5 is a sectional view illustrating a coupling of an interposer, a first substrate, and a second substrate of an electronic device according to an embodiment.

FIG. 5 is a sectional view illustrating a coupling of an interposer 200, the first substrate 150, and the second substrate 190 of the electronic device according to an embodiment.

Referring to FIG. 5, the interposer 200 may include a first contact surface 203 making contact with the first substrate 150, a second contact surface 204 making contact with the second substrate 190, an inner surface 201 that is formed between the first contact surface 203 and the second contact surface 204 and that faces toward the shielded space 197, and an outer surface 202 opposite to the inner surface 201. The first contact surface 203 and the second contact surface 204 may face directions perpendicular to the inner surface 201 and/or the outer surface 202.

When the second substrate 190 is located in the first direction from the first substrate 150, the first contact surface 203 of the interposer 200 may face a second direction opposite to the first direction, the second contact surface 204 of the interposer 200 may face the first direction, and the inner surface 201 and the outer surface 202 of the interposer 200 may face third directions perpendicular to the first direction and the second direction, respectively.

The interposer 200 may include a plurality of stacked layers. The plurality of layers may face a direction toward the shielded space 197 or a direction away from the shielded space 197. For example, the plurality of layers may face the third direction. For example, the plurality of layers included in the interposer 200 may be stacked in a direction perpendicular to a plurality of layers included in the first substrate 150 or the second substrate 190.

The plurality of layers may include a first conductive layer 210, a second conductive layer 220, and a pattern layer 230 formed between the first conductive layer 210 and the second conductive layer 220. The pattern layer 230 may include a conductive pattern 2301 that electrically connects the first substrate 150 and the second substrate 190. Insulation layers 240 may be formed between the first conductive layer 210 and the pattern layer 230 and between the second conductive layer 220 and the pattern layer 230.

The first conductive layer 210 may form the inner surface 201, and the second conductive layer 220 may form the outer surface 202. Furthermore, the first conductive layer 210, the second conductive layer 220, the pattern layer 230, and the insulation layers 240 may form the first contact surface 203 and the second contact surface 204 together.

The first substrate 150 may include a first signal line 152. The second substrate 190 may include a second signal line 192. The conductive pattern 2301 may electrically connect the first signal line 152 and the second signal line 192.

The first substrate 150 may include first ground interconnections 153. The second substrate 190 may include second ground interconnections 193. The first conductive layer 210 may be electrically connected to the first ground interconnection 153 and the second ground interconnection 193 and may be formed as a ground area. The second conductive layer 220 may be electrically connected to the first ground interconnection 153 and the second ground interconnection 193 and may be formed as a ground area.

The conductive pattern 2301 through which an electrical signal flows may be formed between the first conductive layer 210 and the second conductive layer 220 that are formed as the ground areas. Accordingly, noise generated by the electrical signal flowing through the conductive pattern 2301 may be shielded.

Figure 6A:
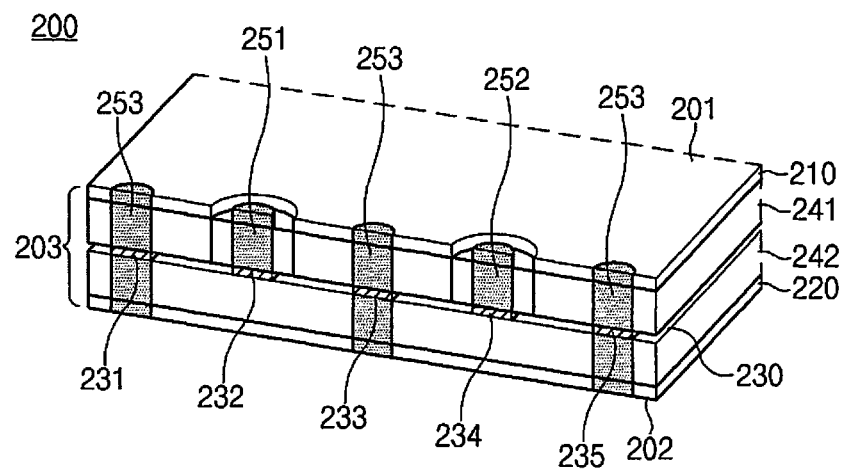
FIGS. 6A and 6B are perspective views of an interposer of an electronic device according to an embodiment.
Figure 6B:
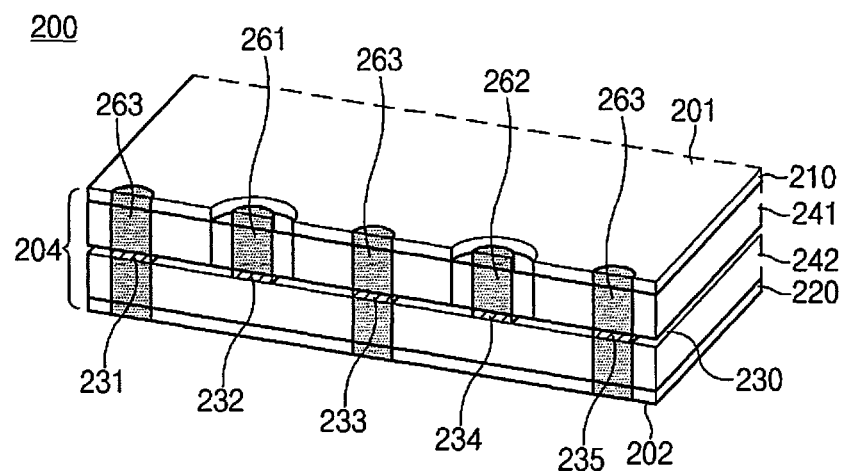
Figure 7:
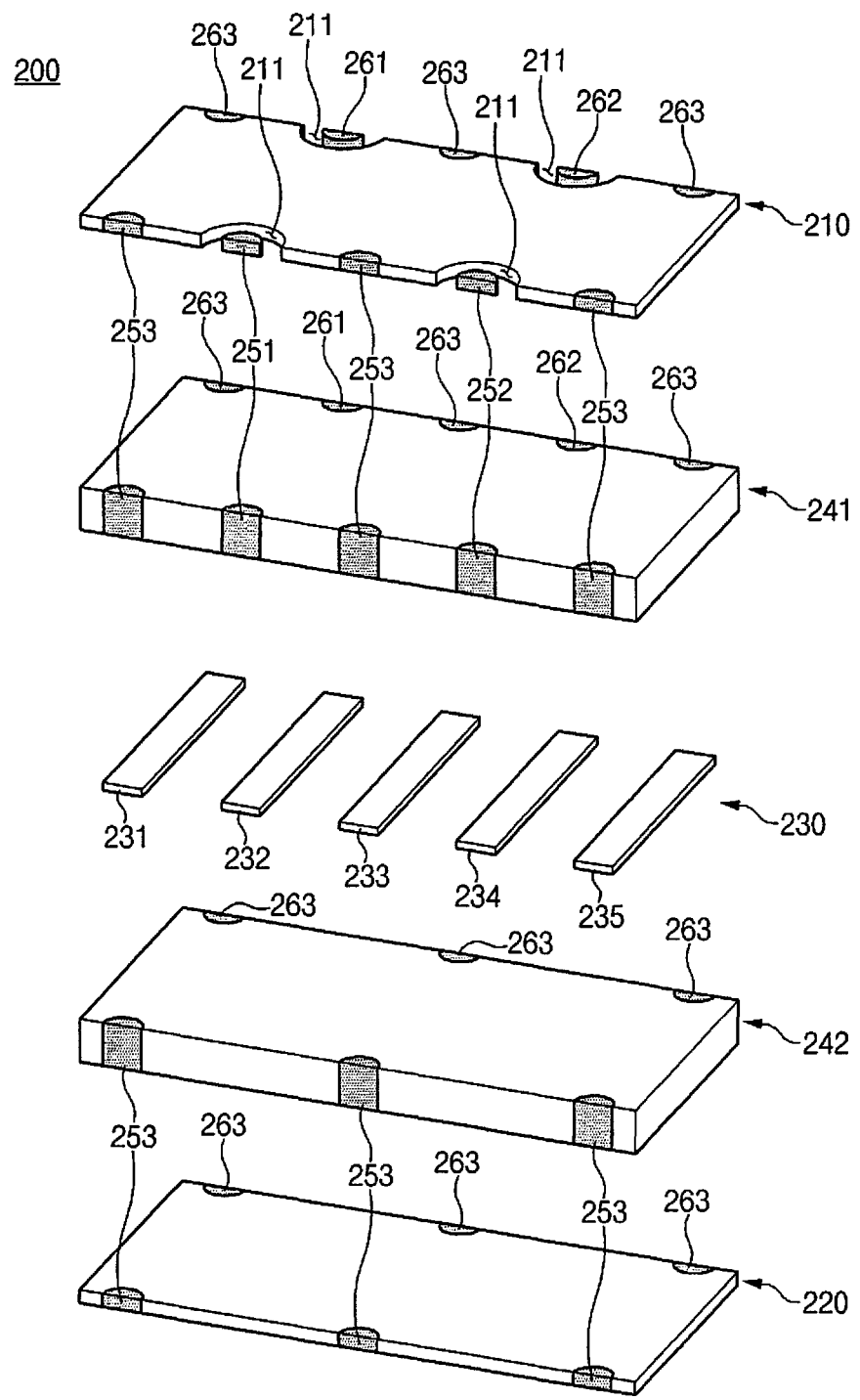
FIG. 7 is an exploded perspective view of the interposer illustrated in FIG. 6 according to an embodiment.

FIGS. 6A and 6B are perspective views of the interposer 200 of the electronic device according to an embodiment. FIG. 7 is an exploded perspective view of the interposer 200 illustrated in FIGS. 6A and 6B.

Referring to FIGS. 6A, 6B, and 7, the interposer 200 may include a plurality of layers.

The plurality of layers may include the first conductive layer 210, the second conductive layer 220, the pattern layer 230 formed between the first conductive layer 210 and the second conductive layer 220, and the insulation layers 240. The insulation layers 240 may include a first insulation layer 241 formed between the first conductive layer 210 and the pattern layer 230 and a second insulation layer 242 formed between the second conductive layer 220 and the pattern layer 230.

As described above, each of the first conductive layer 210 and the second conductive layer 220 may be electrically connected with the first ground interconnection included in the first substrate 150 (e.g., the first ground interconnection 153 of FIG. 5) and/or the second ground interconnection included in the second substrate 190 (e.g., the second ground interconnection 193 of FIG. 5) and may be formed as the ground area.

The interposer 200 may include the first contact surface 203 brought into contact with the first substrate 150 and the second contact surface 204 brought into contact with the second substrate 190. The first contact surface 203 and the second contact surface 204 may be formed by end surfaces of the plurality of layers. For example, the first contact surface 203 and the second contact surface 204 may be formed by end surfaces of the first conductive layer 210, the second conductive layer 220, the insulation layers 241 and 242, and the pattern layer 230. In other words, the first contact surface 203 and the second contact surface 204 may be formed in directions perpendicular to the plurality of layers.

The pattern layer 230 may include one or more conductive patterns 2301. The conductive patterns 2301 may include a first conductive pattern 231, a second conductive pattern 232, a third conductive pattern 233, a fourth conductive pattern 234, and a fifth conductive pattern 235 from the left in FIGS. 6A, 6B, and 7.

Referring to FIG. 6A, the first contact surface 203 may include first conductive areas 251, 252, and 253 electrically connected with interconnections (e.g., the first signal line 152 and the first ground interconnections 153) that are included in a first substrate (e.g., the first substrate 150 of FIG. 5).

The first conductive areas 251, 252, and 253 may include the signal areas in first conductive areas 251 and 252 electrically insulated from the first conductive layer 210 and the second conductive layer 220. The signal areas in the first conductive areas 251 and 252 may be electrically connected with the conductive patterns 232 and 234, respectively. The first signal area in the first conductive area 251 may be connected with the second conductive pattern 232, and the second signal area in the first conductive area 252 may be connected with the fourth conductive pattern 234.

The first conductive areas 251, 252, and 253 may include the first ground areas 253 electrically connected with the first conductive layer 210 or the second conductive layer 220. The first ground areas 253 may extend from the first conductive layer 210 to the second conductive layer 220 and may be connected with at least one conductive pattern. The first ground areas 253 may be connected with the first conductive pattern 231, the third conductive pattern 233, and the fifth conductive pattern 235.

Referring to FIG. 6B, the second contact surface 204 may include second conductive areas 261, 262, and 263 that are electrically connected with interconnections (e.g., the second signal line 192 and the second ground interconnections 193) included in a second substrate (e.g., the second substrate 190 of FIG. 5) and that correspond to the first conductive areas 251, 252, and 253 formed on the first contact surface 203. The indication of the expression "correspond to" used herein may include "formed to face each other" and "electrically connected with each other".

The second conductive areas 261, 262, and 263 may include the corresponding signal areas in second the conductive areas 261 and 262 that are electrically insulated from the first conductive layer 210 and the second conductive layer 220 and that correspond to the respective signal areas in the first conductive areas 251 and 252 formed on the first contact surface 203. The corresponding signal areas in the second conductive areas 261 and 262 may be electrically connected with the conductive patterns 232 and 234, respectively. The first corresponding signal area in the second conductive area 261 may correspond to the first signal area in the first conductive area 251 formed on the first contact surface 203 and may be connected with the second conductive pattern 232. The second corresponding signal area in the second conductive area 262 may correspond to the second signal area in the first conductive area 252 formed on the first contact surface 203 and may be connected with the fourth conductive pattern 234.

The second conductive areas 261, 262, and 263 may include the second ground areas 263 that are electrically connected with the first conductive layer 210 or the second conductive layer 220 and that correspond to the first ground areas 253 formed on the first contact surface 203. The second ground areas 263 may extend from the first conductive layer 210 to the second conductive layer 220 and may be connected with at least one conductive pattern. The second ground areas 263 may be connected with the first conductive pattern 231, the third conductive pattern 233, and the fifth conductive pattern 235.

Referring to FIG. 7, the first signal area in the first conductive area 251 and the first corresponding signal area in the second conductive area 261 may be electrically connected by the second conductive pattern 232 and may form a first signal transmission path together with the second conductive pattern 232. The second signal area in the first conductive area 252 and the second corresponding signal area in the second conductive area 262 may be electrically connected by the fourth conductive pattern 234 and may form a second signal transmission path together with the fourth conductive pattern 234.

The signal areas in the first conductive areas 251 and 252 and the corresponding signal areas in the second conductive areas 261 and 262 may be formed on end surfaces of the first insulation layer 241 and may form at least a portion of the first contact surface 203 and at least a portion of the second contact surface 204.

The signal areas in the first conductive areas 251 and 252 and the corresponding signal areas in the second conductive areas 261 and 262 may extend from the first insulation layer 241 to some of the conductive patterns of the pattern layer 230 (e.g., the second conductive pattern 232 and the fourth conductive pattern 234).

The signal areas in the first conductive areas 251 and 252 and the corresponding signal areas in the second conductive areas 261 and 262 may be formed in partial areas of the first conductive layer 210. The signal areas in the first conductive areas 251 and 252 and the corresponding signal areas in the second conductive areas 261 and 262 may be physically spaced apart from and thus electrically insulated from the remaining area of the first conductive layer 210. For example, the signal areas in the first conductive areas 251 and 252 and the corresponding signal areas in the second conductive areas 261 and 262 may be electrically insulated from the remaining area of the first conductive layer 210 by openings 211.

The first ground areas 253 and the second ground areas 263 may extend from the first conductive layer 210 to the second conductive layer 220. The first ground areas 253 and the second ground areas 263 may be formed in the first insulation layer 241 and the second insulation layer 242.

The signal areas in the first conductive areas 251 and 252 may be substantially formed between the first ground areas 253. The corresponding signal areas in the second conductive areas 261 and 262 may be substantially formed between the second ground areas 263.

Likewise, conductive patterns (e.g., the second conductive pattern 232 and the fourth conductive pattern 234) that form signal transmission paths from the signal areas in the first conductive areas 251 and 252 to the corresponding signal areas in the second conductive areas 261 and 262 may be formed between conductive patterns (e.g., the first conductive pattern 231, the third conductive pattern 233, and the fifth conductive pattern 235) that are formed as ground areas.

That is, the electrical paths may be substantially surrounded by the ground areas (e.g., the first conductive layer 210, the second conductive layer 220, the first ground areas 253, the second ground areas 263, and the conductive patterns 231, 233, and 235 connected thereto). Accordingly, noise generated by electrical signals may be shielded.

Figure 8:
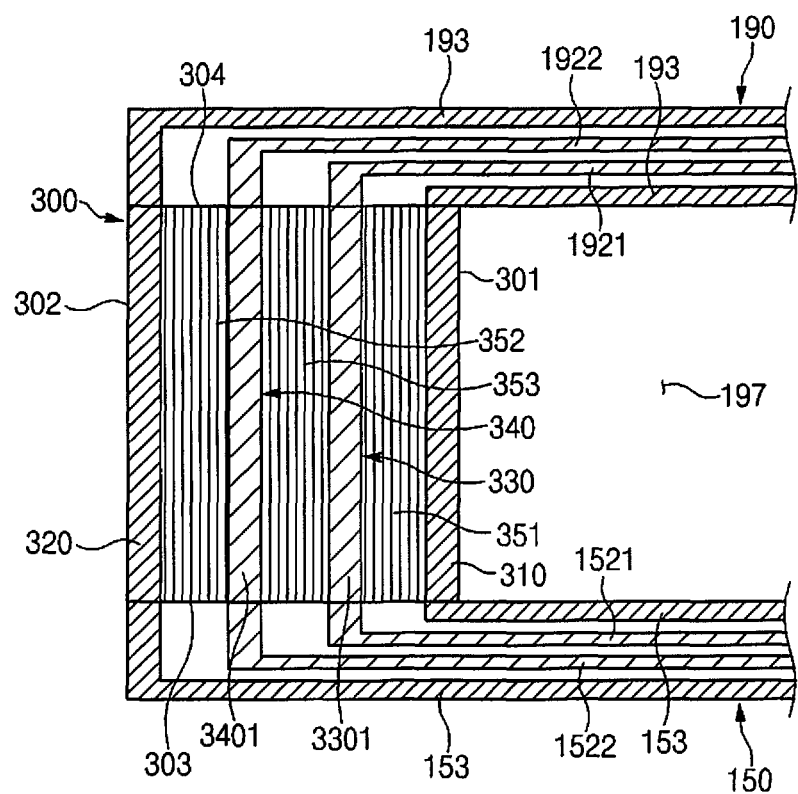
FIG. 8 is a sectional view illustrating a coupling of an interposer, a first substrate, and a second substrate of an electronic device according to an embodiment.

FIG. 8 is a sectional view of an interposer 300 of the electronic device according to an embodiment.

Referring to FIG. 8, the electronic device may include the first substrate 150, the second substrate 190 spaced apart from the first substrate 150 in the first direction, and a plurality of interposers 300 formed between the first substrate 150 and the second substrate 190. The first substrate 150 and the second substrate 190 are the same as those described above with reference to FIG. 3, and therefore descriptions thereabout are omitted below.

The interposer 300 may include a first contact surface 303 making contact with the first substrate 150, a second contact surface 304 making contact with the second substrate 190, an inner surface 301 that is formed between the first contact surface 303 and the second contact surface 304 and that faces toward the shielded space 197, and an outer surface 302 opposite to the inner surface 301. The first contact surface 303 and the second contact surface 304 may face directions perpendicular to the inner surface 301 and/or the outer surface 302.

When the second substrate 190 is located in the first direction from the first substrate 150, the first contact surface 303 of the interposer 300 may face the second direction opposite to the first direction, the second contact surface 304 of the interposer 300 may face the first direction, and the inner surface 301 and the outer surface 302 of the interposer 300 may face the third directions perpendicular to the first direction and the second direction, respectively.

The interposer 300 may include a plurality of stacked layers. The plurality of layers may face a direction toward the shielded space 197 or a direction away from the shielded space 197. For example, the plurality of layers may face the third direction. For example, the plurality of layers included in the interposer 300 may be stacked in a direction perpendicular to a plurality of layers included in the first substrate 150 or the second substrate 190.

The plurality of layers may include a first conductive layer 310, a second conductive layer 320, a first pattern layer 330 formed between the first conductive layer 310 and the second conductive layer 320, a second pattern layer 340 formed between the first pattern layer 330 and the second conductive layer 320, and insulation layers 351, 352, and 353. The insulation layers 351, 352, and 353 may include the first insulation layer 351 formed between the first conductive layer 310 and the first pattern layer 330, the second insulation layer 352 formed between the second conductive layer 320 and the second pattern layer 340, and the third insulation layer 353 formed between the first pattern layer 330 and the second pattern layer 340.

The first pattern layer 330 may include a first conductive pattern 3301 that electrically connects the first substrate 150 and the second substrate 190. The second pattern layer 340 may include a second conductive pattern 3401 that electrically connects the first substrate 150 and the second substrate 190. Each of the conductive patterns 3301 and 3401 may be formed by etching a portion of a layer formed of a conductive material.

The first conductive layer 310 may form the inner surface 301, and the second conductive layer 320 may form the outer surface 302. Furthermore, the first conductive layer 310, the second conductive layer 320, the first pattern layer 330, the second pattern layer 340, and the insulation layers 351, 352, and 353 may form the first contact surface 303 and the second contact surface 304.

The first substrate 150 may include signal line 1-1 1521 and signal line 1-2 1522. The second substrate 190 may include signal line 2-1 1921 and signal line 2-2 1922.

The first conductive pattern 3301 may extend from the first substrate 150 to the second substrate 190 to electrically connect signal line 1-1 1521 and signal line 2-1 1921. The extension direction of the first conductive pattern 3301 may be a direction perpendicular to the direction that the plurality of layers face.

The second conductive pattern 3401 may extend from the first substrate 150 to the second substrate 190 to electrically connect signal line 1-2 1522 and signal line 2-2 1922. The extension direction of the second conductive pattern 3401 may be a direction perpendicular to the direction that the plurality of layers face.

The first substrate 150 may include the first ground interconnections 153. The second substrate 190 may include the second ground interconnections 193. The first conductive layer 310 may be electrically connected to the first ground interconnection 153 and the second ground interconnection 193 and may be formed as a ground area. The second conductive layer 320 may be electrically connected to the first ground interconnection 153 and the second ground interconnection 193 and may be formed as a ground area.

The first conductive pattern 3301 and the second ground pattern 3401 through which electrical signals flow may be formed between the first conductive layer 310 and the second conductive layer 320 that are formed as the ground areas. Accordingly, noise generated by the electrical signals flowing through the conductive pattern 3301 and the second conductive pattern 3401 may be shielded.

Figure 9A:
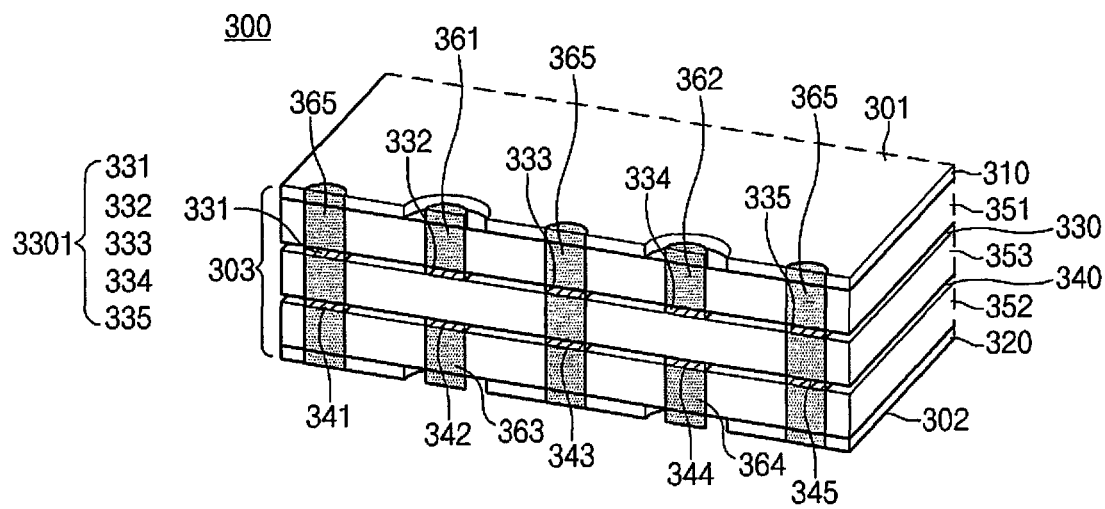
FIGS. 9A and 9B are perspective views of an interposer of an electronic device according to an embodiment.
Figure 9B:
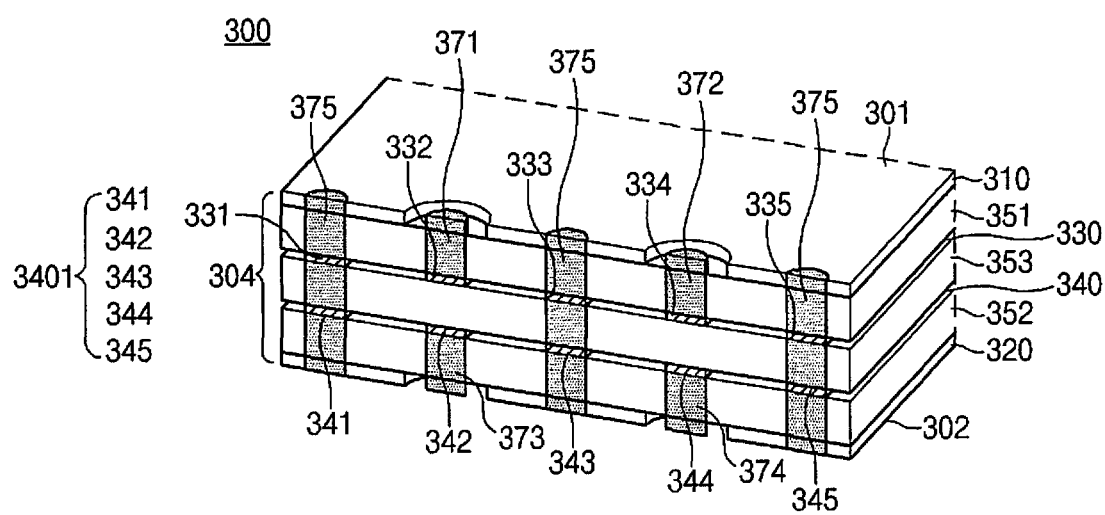
Figure 10:
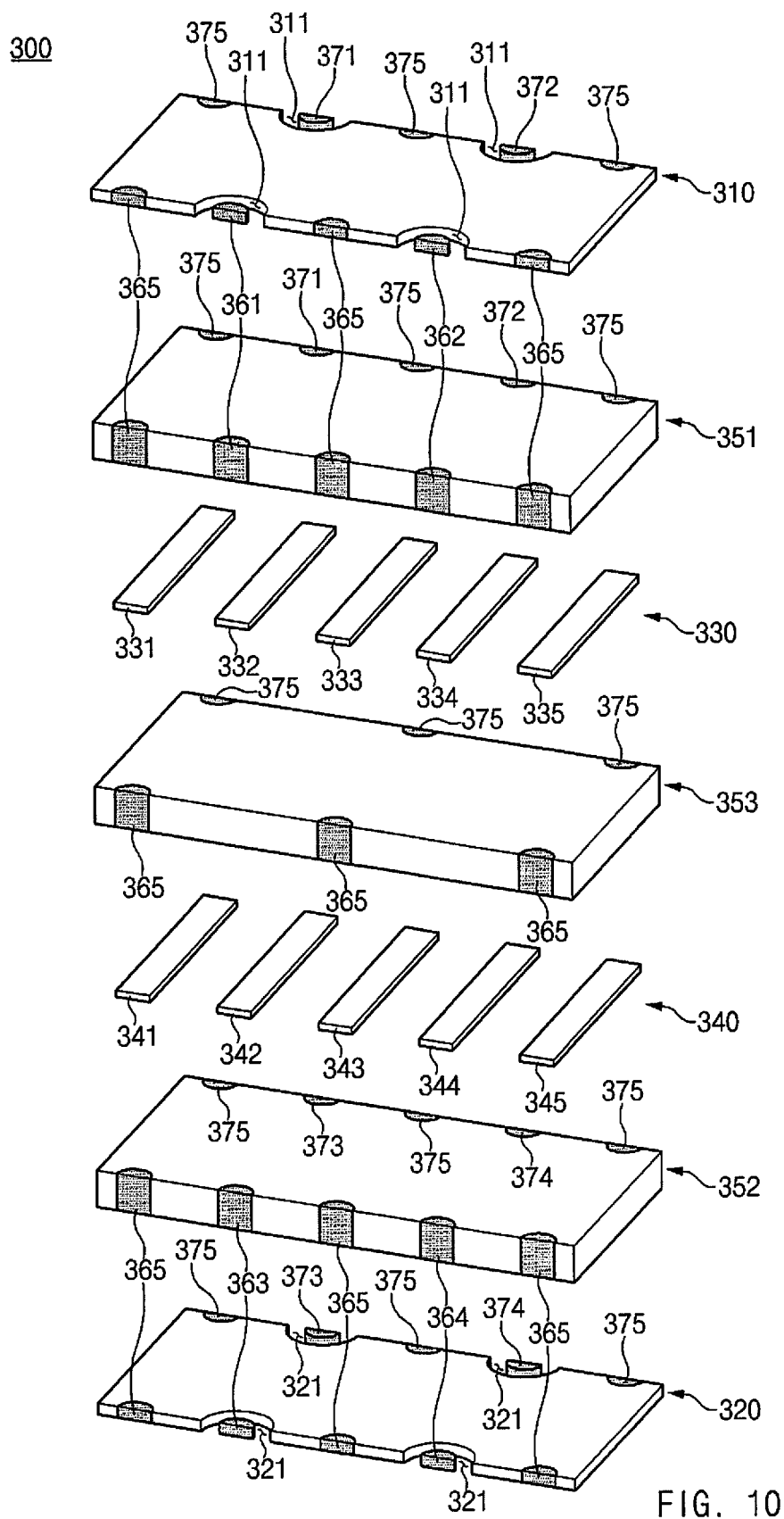
FIG. 10 is an exploded perspective view of the interposer illustrated in FIG. 9 according to an embodiment.

FIGS. 9A and 9B are perspective views of the interposer 300 of the electronic device according to an embodiment. FIG. 10 is an exploded perspective view of the interposer 300 illustrated in FIGS. 9A and 9B.

Referring to FIGS. 9A, 9B, and 10, the interposer 300 may include the plurality of layers.

The plurality of layers may include the first conductive layer 310 that forms the inner surface 301 facing toward the shielded space 197, the second conductive layer 320 that forms the outer surface 302 opposite to the inner surface 301, the first pattern layer 330 formed between the first conductive layer 310 and the second conductive layer 320, the second pattern layer 340 formed between the first pattern layer 330 and the second conductive layer 320, and the insulation layers 351, 352, and 353.

The insulation layers 351, 352, and 353 may include the first insulation layer 351 formed between the first conductive layer 310 and the first pattern layer 330, the second insulation layer 352 formed between the second conductive layer 320 and the second pattern layer 340, and the third insulation layer 353 formed between the first pattern layer 330 and the second pattern layer 340.

As described above, the first conductive layer 310 and the second conductive layer 320 may be electrically connected with first ground interconnections included in the first substrate 150 (e.g., the first ground interconnections 153 of FIG. 8) and/or second ground interconnections included in the second substrate 190 (e.g., the second ground interconnections 193 of FIG. 8) and may be formed as the ground areas.

The interposer 300 may include the first contact surface 303 brought into contact with the first substrate 150 and the second contact surface 304 brought into contact with the second substrate 190. The first contact surface 303 and the second contact surface 304 may be formed by end surfaces of the plurality of layers. The first contact surface 303 and the second contact surface 304 may be formed by end surfaces of the first conductive layer 310, the second conductive layer 320, the insulation layers 351, 352, and 353, the first pattern layer 330, and the second pattern layer 340. In other words, the first contact surface 303 and the second contact surface 304 may be formed in directions perpendicular to the plurality of layers.

The first pattern layer 330 may include one or more first conductive patterns 3301. The first conductive patterns 3301 may include conductive pattern 1-1 331, conductive pattern 1-2 332, conductive pattern 1-3 333, conductive pattern 1-4 334, and conductive pattern 1-5 335 from the left with respect to FIG. 9A.

The second pattern layer 340 may include one or more second conductive patterns 3401. The second conductive patterns 3401 may include conductive pattern 2-1 341, conductive pattern 2-2 342, conductive pattern 2-3 343, conductive pattern 2-4 344, and conductive pattern 2-5 345 from the left with respect to FIG. 9B.

The first conductive patterns 3301 and the second conductive patterns 3401 may be formed in substantially corresponding positions.

Referring to FIG. 9A, the first contact surface 303 may include first conductive areas 361, 362, 363, 364, and 365 that are electrically connected with the interconnections included in the first substrate 150 (e.g., signal line 1-1 1521, signal line 1-2 1522, and the ground interconnections 153) and the conductive patterns 3301 and 3401.

The first conductive areas 361, 362, 363, 364, and 365 may include signal areas in the first conductive areas 361, 362, 363, and 364 electrically insulated from the first conductive layer 310 and the second conductive layer 320. The signal areas in first conductive areas 361, 362, 363, and 364 may be electrically connected with the conductive patterns 332, 334, 342, and 344, respectively. That is, the signal areas in the first conductive areas 361, 362, 363, and 364 may correspond to the conductive patterns 332, 334, 342, and 344 in a one-to-one manner.

The first signal area in the first conductive area 361 may be connected with conductive pattern 1-2 332, the second signal area in the first conductive area 362 may be connected with conductive pattern 1-4 334, the third signal area in the first conductive area 363 may be connected with conductive pattern 2-2 342, and the fourth signal area in the first conductive area 364 may be connected with conductive pattern 2-4 334.

The first conductive areas 361, 362, 363, 364, and 365 may include the first ground areas 365 electrically connected with the first conductive layer 310 or the second conductive layer 320. The first ground areas 365 may extend from the first conductive layer 310 to the second conductive layer 320 and may be connected with the one or more conductive patterns 331, 333, 335, 341, 343, and 345. The first ground areas 365 may be connected with conductive pattern 1-1 331, conductive pattern 1-3 333, conductive pattern 1-5 335, conductive pattern 2-1 341, conductive pattern 2-3 343, and conductive pattern 2-5 345.

The first signal area in the first conductive area 361 and the third signal area in the first conductive area 363 may be insulated from each other with the third insulation layer 353 therebetween. The second signal area in the first conductive area 362 and the fourth signal area in the first conductive area 364 may be insulated from each other with the third insulation layer 353 therebetween. In contrast, the first ground areas 365 may extend from the first conductive layer 310 to the second conductive layer 320 through the third insulation layer 353.

Referring to FIG. 9B, the second contact surface 304 may include second conductive areas 371, 372, 373, 374, and 375 that are electrically connected with the interconnections included in the second substrate 190 (e.g., signal line 2-1 1921, signal line 2-2 1922, and the ground interconnections 193) and the conductive patterns 3301 and 3401.

The second conductive areas 371, 372, 373, 374, and 375 may include the corresponding signal areas in the second conductive areas 371, 372, 373, and 374 that are electrically insulated from the first conductive layer 310 and the second conductive layer 320 and that correspond to the signal areas in the first conductive areas 361, 362, 363, and 364 formed on the first contact surface 303. The indication of the expression "correspond to" used herein may include "formed to face each other" and "electrically connected with each other".

Referring to FIG. 10, the first corresponding signal area in the second conductive area 371 may correspond to the first signal area in the first conductive area 361 and may be connected with conductive pattern 1-2 332. The second corresponding signal area in the second conductive area 372 may correspond to the second signal area in the first conductive area 362 and may be connected with conductive pattern 1-4 334. The third corresponding signal area in the second conductive areas 373 may correspond to the third signal area in the first conductive area 363 and may be connected with conductive pattern 2-2 342. The fourth corresponding signal area in the second conductive area 374 may correspond to the fourth signal area in the first conductive area 364 and may be connected with conductive pattern 2-4 344.

Referring to FIG. 9B, the second conductive areas 371, 372, 373, 374, and 375 may include the second ground areas 375 electrically connected with the first conductive layer 310 or the second conductive layer 320. The second ground areas 375 may extend from the first conductive layer 310 to the second conductive layer 320 and may be connected with the one or more conductive patterns 331, 333, 335, 341, 343, and 345. The second ground areas 375 may be connected with conductive pattern 1-1 331, conductive pattern 1-3 333, conductive pattern 1-5 335, conductive pattern 2-1 341, conductive pattern 2-3 343, and conductive pattern 2-5 345.

The first corresponding signal area in the second conductive area 371 and the third corresponding signal area in the second conductive area 373 may be insulated from each other with the third insulation layer 353 therebetween. The second corresponding signal area in the second conductive area 372 and the fourth corresponding signal area in the second conductive area 374 may be insulated from each other with the third insulation layer 353 therebetween. In contrast, the second ground areas 375 may extend from the first conductive layer 310 to the second conductive layer 320 through the third insulation layer 353.

Referring to FIG. 10, the first signal area in the first conductive area 361 and the first corresponding signal area in the second conductive area 371 may be electrically connected by conductive pattern 1-2 332 and may form a first signal transmission path together with conductive pattern 1-2 332. The second signal area in the first conductive area 362 and the second corresponding signal area in the second conductive area 372 may be electrically connected by conductive pattern 1-4 334 and may form a second signal transmission path together with conductive pattern 1-4 334. The third signal area in the first conductive area 363 and the third corresponding signal area in the second conductive area 373 may be electrically connected by conductive pattern 2-2 342 and may form a third signal transmission path together with conductive pattern 2-2 342. The fourth signal area in the first conductive area 364 and the fourth corresponding signal area in the second conductive area 374 may be electrically connected by conductive pattern 2-4 344 and may form a fourth signal transmission path together with conductive pattern 2-4 344.

The signal transmission paths may electrically connect the first signal lines 1521 and 1522 included in the first substrate 150 and the second signal lines 1921 and 1922 included in the second substrate 190.

The first signal area in the first conductive area 361, the first corresponding signal area in the second conductive area 371, the second signal area in the first conductive area 362, and the second corresponding signal area in the second conductive area 372 may be formed in the first insulation layer 351. The first signal area in the first conductive area 361, the first corresponding signal area in the second conductive area 371, the second signal area in the first conductive area 362, and the second corresponding signal area in the second conductive area 372 may extend from the first insulation layer 351 to the conductive patterns of the first pattern layer 330.

The first signal area in the first conductive area 361, the first corresponding signal area in the second conductive area 371, the second signal area in the first conductive area 362, and the second corresponding signal area in the second conductive area 372 may be formed in partial areas of the first conductive layer 310. The first signal area in the first conductive area 361, the first corresponding signal area in the second conductive area 371, the second signal area in the first conductive area 362, and the second corresponding signal area in the second conductive area 372 may be physically spaced apart from and thus electrically insulated from the remaining area of the first conductive layer 310.

For example, the first signal area in the first conductive area 361, the first corresponding signal area in the second conductive area 371, the second signal area in the first conductive area 362, and the second corresponding signal area in the first conductive area 372 may be electrically insulated from the remaining area of the first conductive layer 310 by openings 311.

The third signal area in the first conductive area 363, the third corresponding signal area in the second conductive area 373, the fourth signal area in the first conductive area 364, and the fourth corresponding signal area in the second conductive area 374 may be formed in the second insulation layer 352. The third signal area in the first conductive area 363, the third corresponding signal area in the second conductive area 373, the fourth signal area in the first conductive area 364, and the fourth corresponding signal area in the second conductive area 374 may extend from the second insulation layer 352 to the conductive patterns of the second pattern layer 340. The third signal area in the first conductive area 363, the third corresponding signal area in the second conductive area 373, the fourth signal area in the first conductive area 364, and the fourth corresponding signal area in the second conductive area 374 may be formed in partial areas of the second conductive layer 320. The third signal area in the second conductive area 363, the third corresponding signal area in the second conductive area 373, the fourth signal area in the first conductive area 364, and the fourth corresponding signal area in the second conductive area 374 may be physically spaced apart from and, thus, electrically insulated from the remaining area of the second conductive layer 320.

For example, the third signal area in the first conductive area 363, the third corresponding signal area in the second conductive area 373, the fourth signal area in the first conductive area 364, and the fourth corresponding signal area in the second conductive area 374 may be electrically insulated from the remaining area of the second conductive layer 320 by openings 321.

The first conductive areas 361, 362, 363, 364, and 365 and the second conductive areas 371, 372, 373, 374, and 375 may each include a via-hole formed through at least some of the plurality of stacked layers 310, 351, 330, 353, 340, 352, and 320 and a conductive material with which the via-hole is filled. The openings 311 and 321 may be land holes having a greater diameter than the via-hole.

The first ground areas 365 and the second ground areas 375 may extend from the first conductive layer 310 to the second conductive layer 320. The first ground areas 365 and the second ground areas 375 may be formed in the first insulation layer 351, the second insulation layer 352, and the third insulation layer 353.

The first ground areas 365 and the second ground areas 375 may be electrically connected by the first conductive layer 310 and/or the second conductive layer 320. Further, the first ground areas 365 and the second ground areas 375 may be electrically connected by some of the conductive patterns (e.g., conductive pattern 1-1 331, conductive pattern 1-3 333, conductive pattern 1-5 335, conductive pattern 2-1 341, conductive pattern 2-3 343, and conductive pattern 2-5 345).

The first signal area 361, the second signal area 362, the third signal area 363, and the fourth signal area 364 may be substantially formed between the first ground areas 365. The first corresponding signal area 371, the second corresponding signal area 372, the third corresponding signal area 373, and the fourth corresponding signal area 374 may be substantially formed between the second ground areas 375.

Likewise, the conductive patterns 332, 334, 342, and 344 that transmit electrical signals between the signal areas and the corresponding signal areas may be formed between the conductive patterns 331, 333, 335, 341, 343, and 345 connected to the first ground areas 365 and the second ground areas 375. Accordingly, noise generated by the electrical signals may be shielded.

Figure 11A:
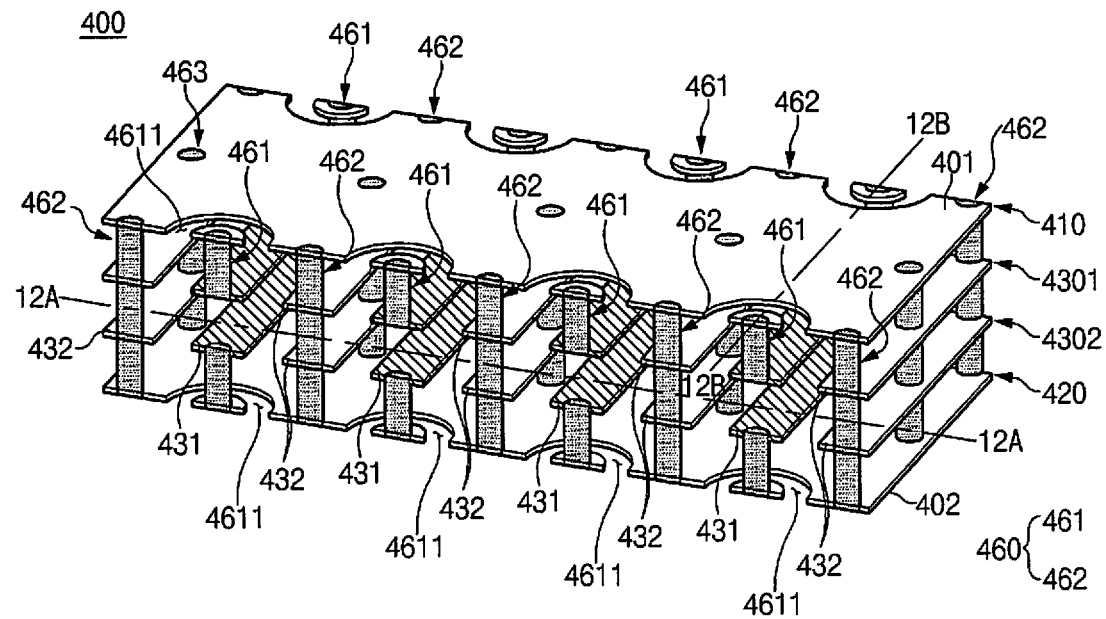
FIG. 11A is a view illustrating an interposer of an electronic device according to according to an embodiment.
Figure 11B:
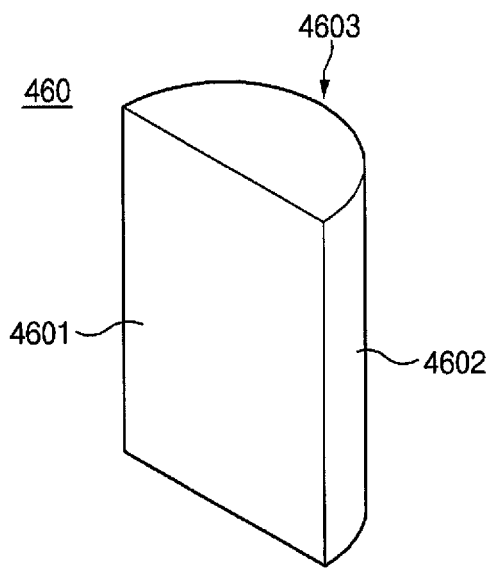
FIG. 11B is a view illustrating a via of the interposer illustrated in FIG. 11A according to an embodiment.

FIG. 11A is a view illustrating an interposer 400 of the electronic device according to an embodiment. FIG. 11B is a view illustrating a via 460 of the interposer illustrated in FIG. 11A.

Referring to FIGS. 11A and 11B, the interposer 400 may be understood as the interposer 300 illustrated in FIG. 9 from which the insulation layers are omitted.

The interposer 400 may include a plurality of layers including a first conductive layer 410, a second conductive layer 420, a first pattern layer 4301, and a second pattern layer 4302. The interposer 400 may include one or more vias 461 and 462 that are formed at the edges of the plurality of layers and that pass through at least some of the plurality of layers.

The one or more vias 461 and 462 may include first vias 461 passing through some of the plurality of layers and second vias 462 passing through all of the plurality of layers.

The interposer 400 disclosed herein is not necessarily limited to including the vias 461 and 462. For example, the interposer 400 may include plated areas that are connected with conductive patterns 431 and 432 included in the pattern layers and are formed on opposite side surfaces of the plurality of layers. The plated areas may correspond to flat surface portions 4601 of the vias 461 and 462. That is, the plated areas may form conductive areas (e.g., 361, 362, 363, 364, 365, 371, 372, 373, 374, and 375 of FIGS. 9A, 9B, and 10) that are connected with the conductive patterns and are formed on side surfaces of the interposer 400.

The first vias 461 may extend from conductive layers (e.g., the first conductive layer 410 and the second conductive layer 420) that form surfaces (e.g., the outer surface and the inner surface) of the interposer 400 to pattern layers (e.g., the first pattern layer 4301 and the second pattern layer 4302) that are most adjacent to the conductive layers 410 and 420. The first vias 461 may be physically spaced apart from the conductive layers 410 and 420 by openings 4611 and thus electrically insulated from the conductive layers 410 and 420.

The second vias 462 may extend from one of the conductive layers (e.g., the first conductive layer 410 and the second conductive layer 420) that form the surfaces (e.g., the outer surface and the inner surface) of the interposer 400 to the other conductive layer. The second vias 462 may be electrically connected with at least one of the conductive layers (e.g., the first conductive layer 410 and the second conductive layer 420).

The first vias 461 and the second vias 462 may each have at least a portion that forms a portion of the surfaces of the interposer 400. The first vias 461 and the second vias 462 may each include the flat surface portion 4601 and a curved surface portion 4602.

The flat surface portions 4601 may form contact surfaces of the interposer 400 (e.g., the first contact surface 303 and the second contact surface 304 of FIG. 8) that make contact with a first surface (e.g., the first substrate 150 of FIG. 8) or a second substrate (e.g., the second substrate 190 of FIG. 8). The curved surface portions 4602 may have an arc shape when viewed from above the plurality of layers. For example, the curved surface portions 4602 may have a semicircular shape when viewed from above the plurality of layers.

Figure 12A:
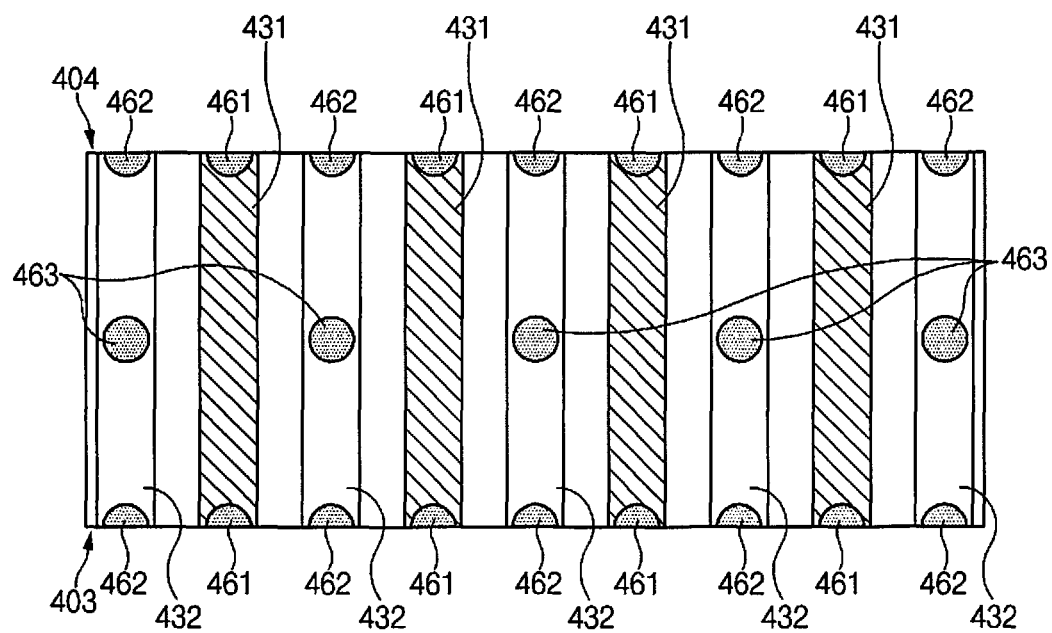
FIG. 12A is a sectional view taken along line 12A-12A in FIG. 11A according to an embodiment.
Figure 12B:
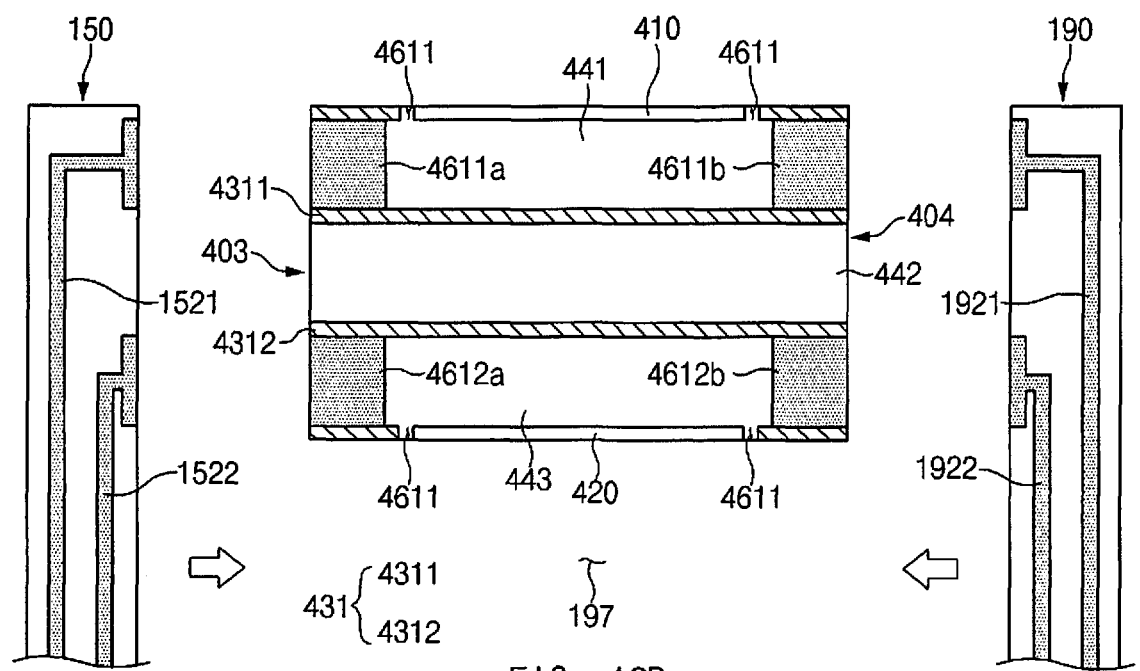
FIG. 12B is a sectional view taken along line 12B-12B in FIG. 11A according to an embodiment.

The interposer 400 may include a contact surface (e.g., the first contact surface 403 and the second contact surface 404 of FIG. 12A and FIG. 12B) that is perpendicular to a first surface 401 and a second surface 402 and that is brought into contact with a substrate (e.g., the first substrate 150 or the second substrate 190 of FIG. 8). The contact surface may include conductive areas that make electrical contact with interconnections included in the substrate (e.g., the first substrate 150 or the second substrate 190 of FIG. 8).

The conductive areas (e.g., 361, 362, 363, 364, and 365 of FIG. 9) may be formed by the flat surface portions 4601 of the first vias 461 and the second vias 462. The conductive areas may include cutting surfaces formed by cutting the plurality of layers, in which the first vias 461 and the second vias 462 are formed, in the direction transverse to the first vias 461 and the second vias 462.

The interposer 400 may further include third vias 463 that pass through all of the plurality of layers and that have a substantially circular cross-section. The third vias 463 may firmly combine the plurality of layers by passing through all of the plurality of layers. The third vias 463 may pass through the second conductive patterns 432 through which the second vias 462 pass. Accordingly, the third vias 463 may be formed as ground areas.

The conductive patterns may include the first conductive patterns 431 (the patterns represented by slant lines) that are electrically connected with the first vias 461 and the second conductive patterns 432 that are electrically connected with the second vias 462.

Electrical signals transmitted from the first vias 461 may flow through the first conductive patterns 431, and ground signals transmitted from the second vias 462 may flow through the second conductive patterns 432. The first conductive patterns 431 may be formed between the second conductive patterns 432, and thus noise generated by the electrical signals may be shielded.

FIG. 12A illustrates sectional views taken along line 12A-12A illustrated in FIG. 11A. FIG. 12B illustrates sectional views taken along line 12B-12B illustrated in FIG. 11A.

Referring to FIG. 12A, the interposer 400 may include the first contact surface 403 and a second contact surface 404. The interposer 400 may be disposed between the first substrate 150 and the second substrate 190 such that the first contact surface 403 is disposed on the first substrate 150 and the second contact surface 404 is disposed on the second substrate 190.

The first conductive patterns 431 and the second conductive patterns 432 may be formed side by side. The first conductive patterns 431 and the second conductive patterns 432 may each have a first end portion that forms a portion of the first contact surface 403 and a second end portion that forms a portion of the second contact surface 404.

The first vias 461 may pass through the first end portions and the second end portions of the first conductive patterns 431. The second vias 462 may pass through the first end portions and the second end portions of the second conductive patterns 432. The third vias 463 may pass through the areas between the first end portions and the second end portions of the second conductive patterns 432.

Referring to FIG. 12B, the first conductive patterns 431 through which the electrical signals flow may include conductive pattern 1-1 4311 formed between a first insulation layer 441 and a second insulation layer 442 and conductive pattern 1-2 4312 formed between the second insulation layer 442 and a third insulation layer 443.

The first vias 461 may include via 1-1-*a* 4611*a* that forms a portion of the first contact surface 403 and that is connected with conductive pattern 1-1 4311 and via 1-2-*a* 4612*a* that forms a portion of the first contact surface 403 and that is connected with conductive pattern 1-2 4312.

The first vias 461 may include via 1-1-*b* 4611*b* that forms a portion of the second contact surface 404 and that is connected with conductive pattern 1-1 4311 and via 1-2-*b* 4612*b* that forms a portion of the second contact surface 404 and that is connected with conductive pattern 1-2 4312.

Via 1-1-*a* 4611*a*, via 1-1-*b* 4611*b*, and conductive pattern 1-1 4311 may be electrically connected with signal line 1-1 1521 included in the first substrate 150 and signal line 2-1 1921 included in the second substrate 190.

Via 1-2-*a* 4612*a*, via 1-2-*b* 4612*b*, and conductive pattern 1-2 4312 may be electrically connected with signal line 1-2 1522 included in the first substrate 150 and signal line 2-2 1922 included in the second substrate 190.

Conductive pattern 1-1 4311 and conductive pattern 1-2 4312 may be electrically insulated from each other with the second insulation layer 442 therebetween, and thus a first electrical signal and a second electrical signal may flow between the first substrate 150 and the second substrate 190 without a short circuit.

An interposer according to an embodiment of the disclosure may have the following advantageous effects.

An interposer in the related art includes vias extending from a first substrate to a second substrate and is configured such that interconnections included in the respective substrates are electrically connected through the vias. The vias are formed in the direction perpendicular to the stack direction of the substrates by a mechanical drilling process. Due to the limitation of the mechanical drilling process, the vias may have a hole diameter of at least 0.25 mm or more and a land diameter of at least 0.4 mm or more. The numerical ranges are not sufficiently small to apply the vias to a small-sized electronic device. That is, the interposer in the related art cannot provide a sufficient number of vias in the same area.

In contrast, an interposer according to an embodiment of the disclosure may include conductive patterns extending from a first substrate to a second substrate and may be configured such that interconnections included in the respective substrates are electrically connected through the conductive patterns. The conductive patterns may be formed by a pattern printing process that is used in a general PCB manufacturing process. The conductive patterns may have a line-width of 0.01 mm to 0.1 mm and a thickness of 0.01 mm or less. The numerical ranges may be sufficiently small to be applied to a small-sized electronic device. That is, a sufficient number of electrical paths may be provided in the same substrate area. The interposers disclosed herein have an advantageous effect of providing a larger number of electrical connections than the interposer in the related art.

The first substrate and the second substrate may each have one or more electrical elements disposed thereon, and the electrical elements on each substrate may be connected by a pattern printed on the substrate. The pattern may be formed to have a specified resistance value. The conductive patterns included in the interposers disclosed herein may be manufactured by substantially the same process as the manufacturing process for the pattern and may therefore be formed to have substantially the same line-width, thickness, and/or resistance. Accordingly, an advantageous effect may be obtained in which the electrical elements disposed on the respective substrates are stably connected by the interposers.

An interposers according to an embodiment of the disclosure and the electronic device including the interposers may provide more electrical paths in the same area. Furthermore, the interposers may provide electrical paths having substantially the same thickness, line-width, and resistance as conductive patterns formed on substrates. Stack structures including the interposers may more stably connect electrical elements than a substrate stack structure including a conventional interposer.

In addition, the disclosure may provide various effects that are directly or indirectly recognized.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor(e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device, comprising:
   a housing;
   a first substrate disposed in the housing and configured to face a first direction, wherein the first substrate comprises a first interconnection;
   a second substrate located in the first direction from the first substrate, wherein the second substrate comprises a second interconnection; and a plurality of interposers formed between the first substrate and the second substrate to electrically connect the first interconnection and the second interconnection, wherein the plurality of interposers is configured to at least partially surround a shielded space formed between the first substrate and the second substrate, wherein each of the plurality of interposers comprises a plurality of layers configured to face a direction perpendicular to the first direction, and wherein at least one of the plurality of layers comprises a conductive pattern that extends in the first direction and is electrically connected with the first interconnection and the second interconnection.

2. The electronic device of claim 1, wherein each of the plurality of interposers further comprises a first contact area configured to make contact with the first substrate and a second contact area configured to make contact with the second substrate, and wherein the conductive pattern extends from the first contact area to the second contact area.

3. The electronic device of claim 2, wherein the first contact area extends from one end portion of the conductive pattern in the direction perpendicular to the first direction, and wherein the second contact area extends from an opposite end portion of the conductive pattern in the direction perpendicular to the first direction.

4. The electronic device of claim 1, wherein each of the plurality of interposers comprises:

a first surface configured to face toward the shielded space;

a second surface opposite to the first surface;

a first contact surface formed between the first surface and the second surface and brought into contact with the first substrate; and a second contact surface formed between the first surface and the second surface and brought into contact with the second substrate, and wherein the conductive pattern extends from the first contact surface to the second contact surface and is formed between the first surface and the second surface.

5. The electronic device of claim 4, wherein the plurality of layers further comprises:

a first conductive layer configured to form the first surface;

a second conductive layer configured to form the second surface;

a pattern layer formed between the first conductive layer and the second conductive layer, wherein the pattern layer comprises the conductive pattern; and insulation layers formed between the first conductive layer and the pattern layer and between the second conductive layer and the pattern layer.

6. The electronic device of claim 5, wherein each of the first contact surface and the second contact surface is formed by an end surface of at least one of the first conductive layer, the second conductive layer, the pattern layer, and the insulation layers.

7. The electronic device of claim 5, wherein the conductive pattern is electrically insulated from the first conductive layer and the second conductive layer.

8. The electronic device of claim 5, wherein the first contact surface comprises a first contact area electrically connected to the first interconnection, and the second contact surface comprises a second contact area electrically connected to the second interconnection, and wherein the conductive pattern extends from the first contact area to the second contact area.

9. The electronic device of claim 8, wherein each of the first contact area and the second contact area is formed by the pattern layer and part of the insulation layers.

10. An electronic device, comprising:

a housing;

a first substrate disposed in the housing;

a second substrate disposed in the housing and spaced apart from the first substrate; and an interposer disposed between the first substrate and the second substrate, wherein the interposer is formed to surround at least part of any space between the first substrate and the second substrate, wherein the interposer comprises:

a first conductive layer configured to face toward the at least part of any space between the first substrate and the second substrate;

a second conductive layer opposite to the first conductive layer;

a pattern layer formed between the first conductive layer and the second conductive layer, wherein the pattern layer comprises a conductive pattern; and insulation layers formed between the pattern layer and the first conductive layer and between the pattern layer and the second conductive layer, and wherein the interposer is disposed between the first substrate and the second substrate such that the first conductive layer faces toward the at least part of any space between the first substrate and the second substrate and the conductive pattern extends from the first substrate to the second substrate.

11. The electronic device of claim 10, wherein the interposer further comprises a first end surface disposed on the first substrate and a second end surface disposed on the second substrate, wherein the interposer further comprises a first conductive area that extends from the first conductive layer to the pattern layer, is electrically insulated from the first conductive layer, and is electrically connected with the conductive pattern, wherein the first conductive area comprises a conductive area 1-1 configured to form a first portion of the first end surface and a conductive area 1-2 configured to form a first portion of the second end surface, and wherein the conductive area 1-1 and the conductive area 1-2 include a first flat surface configured to face substantially a same direction as an extension direction of the conductive pattern.

12. The electronic device of claim 11, wherein the conductive pattern comprises a first conductive pattern that extends from the conductive area 1-1 to the conductive area 1-2.

13. The electronic device of claim 12, wherein the first substrate comprises a first signal line and a first ground area, wherein the second substrate comprises a second signal line and a second ground area, and wherein the first conductive pattern is electrically connected with the first signal line and the second signal line.

14. The electronic device of claim 11, wherein the interposer further comprises a second conductive area that extends from the first conductive layer to the second conductive layer through the pattern layer and is electrically connected with the first conductive layer, the second conductive layer, and the pattern layer,
wherein the second conductive area comprises a conductive area 2-1 configured to form a second portion of the first end surface and a conductive area 2-2 configured to form a second portion of the second end surface, and
wherein the conductive area 2-1 and the conductive area 2-2 include a second flat surface configured to face substantially the same direction as the extension direction of the conductive pattern.

15. The electronic device of claim 14, wherein the conductive pattern further comprises a second conductive pattern that extends from the conductive area 2-1 to the conductive area 2-2.

16. The electronic device of claim 15, wherein the first substrate comprises a first signal line and a first ground area,
wherein the second substrate comprises a second signal line and a second ground area,
wherein the second conductive pattern is electrically connected with the first ground area and the second ground area, and
wherein the first conductive layer, the second conductive layer, and the second conductive pattern are formed as ground areas.

17. The electronic device of claim 16, wherein the conductive pattern comprises a first conductive pattern that extends from the conductive area 1-1 to the conductive area 1-2, wherein the first conductive pattern comprises a plurality of first conductive patterns, and the second conductive pattern includes a plurality of second conductive patterns, and
wherein the plurality of first conductive patterns is formed between the plurality of second conductive patterns such that electrical signals flowing through the plurality of first conductive patterns are shielded.

18. The electronic device of claim 14, wherein each of the first conductive area and the second conductive area has a substantially rectangular shape.

19. The electronic device of claim 14, wherein each of the first conductive area and the second conductive area is formed by a via-hole and a conductive material with which the via-hole is filled, wherein the via-hole is substantially formed through an edge of at least one of the first conductive layer, the second conductive layer, the pattern layer, and the insulation layers.

20. The electronic device of claim 10, wherein the first substrate and the second substrate comprise a signal pattern through which an electrical signal flows, and
wherein the conductive pattern has substantially a same pattern as the signal pattern.

* * * * *